United States Patent
Chen et al.

(10) Patent No.: US 11,626,281 B2
(45) Date of Patent: Apr. 11, 2023

(54) PEALD NITRIDE FILMS

(71) Applicant: Applied Materials, Inc., Santa Clara, CA (US)

(72) Inventors: Hanhong Chen, Milpitas, CA (US); Philip A. Kraus, San Jose, CA (US); Joseph AuBuchon, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 49 days.

(21) Appl. No.: 17/025,373

(22) Filed: Sep. 18, 2020

(65) Prior Publication Data
US 2021/0090877 A1     Mar. 25, 2021

Related U.S. Application Data

(60) Provisional application No. 62/902,807, filed on Sep. 19, 2019.

(51) Int. Cl.
| | |
|---|---|
| *H01L 21/02* | (2006.01) |
| *C23C 16/34* | (2006.01) |
| *C23C 16/455* | (2006.01) |

(52) U.S. Cl.
CPC .......... *H01L 21/0228* (2013.01); *C23C 16/34* (2013.01); *C23C 16/45542* (2013.01); *H01L 21/0217* (2013.01); *H01L 21/02186* (2013.01); *H01L 21/02205* (2013.01); *H01L 21/02211* (2013.01); *H01L 21/02274* (2013.01)

(58) Field of Classification Search
None
See application file for complete search history.

(56) References Cited

U.S. PATENT DOCUMENTS

| | | | | |
|---|---|---|---|---|
| 6,090,709 | A | * | 7/2000 | Kaloyeros ............... C23C 16/14 438/653 |
| 2008/0242116 | A1 | | 10/2008 | Clark |
| 2016/0079054 | A1 | | 3/2016 | Chen et al. |
| 2018/0061648 | A1 | | 3/2018 | Blomberg et al. |

OTHER PUBLICATIONS

Meng et al., "Atomic Layer Deposition of Silicon Nitride Thin Films: A Review of Recent Progress, Challenges, and Outlooks", Materials 2016, 9, 1007. (Year: 2016).*
PCT International Search Report and Written Opinion in PCT/US2020/051537 dated Dec. 30, 2020, 11 pages.
Ahn, et al., "Characteristics of TiN thin films grown by ALD using TiCl4 and NH3", Metal and material international, vol. 7, No. 6. 2001. pp. 621-625.

(Continued)

*Primary Examiner* — Asok K Sarkar
(74) *Attorney, Agent, or Firm* — Servilla Whitney LLC

(57) ABSTRACT

A method of depositing nitride films is disclosed. Some embodiments of the disclosure provide a PEALD process for depositing nitride films which utilizes separate reaction and nitridation plasmas. In some embodiments, the nitride films have improved growth per cycle (GPC) relative to films deposited by thermal processes or plasma processes with only a single plasma exposure. In some embodiments, the nitride films have improved film quality relative to films deposited by thermal processes or plasma processes with only a single plasma exposure.

18 Claims, 2 Drawing Sheets

(56) References Cited

OTHER PUBLICATIONS

Caubet, et al., "Low-temperature low resistivity PEALD TiN using TDMAT under hydrogen reducing ambient", Journal of the electrochemical society, vol. 155, No. 8 2008. pp. 1-8.

Becker, Jill S., et al., "Atomic Layer Deposition of Insulating Hafnium and Zirconium Nitrides", Chem. Mater. 2004, 16, 3497-3501, Jun. 15, 2004.

Kim, H., "Atomic layer deposition of metal and nitride thin films: Current research efforts and applications for semiconductor device processing", J. Vac. Sci. Technol. B 21(6), Nov. 3, 2003.

\* cited by examiner

PEALD NITRIDE FILMS

CROSS-REFERENCE TO RELATED APPLICATIONS

This application claims priority to U.S. Provisional Application No. 62/902,807, filed Sep. 19, 2019, the entire disclosure of which is hereby incorporated by reference herein.

TECHNICAL FIELD

Embodiments of the present disclosure generally relate to methods for forming nitride films by plasma enhanced atomic layer deposition (PEALD). Some embodiments of the disclosure utilize multiple plasma exposures. Some embodiments of the disclosure provide nitride films at a higher deposition rate, with lower film stress and/or lower resistivity.

BACKGROUND

Nitride films ($M_xN_y$) are an essential material in the manufacturing of semiconductors. For example, titanium nitride often serves as a conductive connection between the active device and the metal contacts used to operate the circuit, while also acting as a diffusion barrier to block the diffusion of the metal from the metal contacts.

Most nitrides can be deposited by a thermal reaction using a precursor, such as $TiCl_4$, and a nitrogen source, such as ammonia. Thermal atomic layer deposition (ALD) methods typically provide films with higher impurities and higher resistivity. Further, these processes must be performed at relatively high substrate temperatures.

In contrast, plasma enhanced atomic layer deposition (PEALD) methods add a plasma exposure. In some PEALD methods, the nitrogen source is provided as a plasma, for example, ammonia plasma. The primary benefit of PEALD methods is the relatively low substrate temperature during processing. PEALD may also utilize as single plasma exposure to perform both a precursor-nitrogen reaction step and a film treatment or densification step.

Unfortunately, the combination of the reaction step and the densification step leads to the incorporation of reaction byproducts into the films as impurities, thereby causing lower film quality. Further, the plasma species may strip hydrogen from the substrate surface, thereby reducing sites for further precursor adsorption and reducing growth rate per cycle (GPC).

Accordingly, there is a need for PEALD methods of depositing nitride films which provide superior growth rate and films of higher quality.

SUMMARY

One or more embodiments of the disclosure are directed to a method of depositing a nitride film. The method comprises exposing a substrate to a precursor to form a reactive species. The reactive species is exposed to a first plasma formed from a first plasma gas to form an activated species. The first plasma comprises N* radicals. The activated species is exposed to a second plasma species formed from a second plasma gas to form the nitride film. The second plasma comprises a NH* radicals.

Additional embodiments of the disclosure are directed to a method of depositing a titanium nitride film. The method comprises exposing a substrate to $TiCl_4$ to form a titanium species on the substrate. The titanium species is exposed to a first plasma formed from a first plasma gas comprising $N_2$ and Ar to form an activated species. The activated species is exposed to a second plasma formed from a second plasma gas comprising $NH_3$ and Ar to form the titanium nitride film. The method defines a deposition cycle and the deposition cycle is repeated to form a titanium nitride film of a predetermined thickness.

Further embodiments of the disclosure are directed to a method of depositing a silicon nitride film. The method comprises exposing a substrate to $SiH_2Cl_2$ to form a silicon species on the substrate. The silicon species is exposed to a first plasma formed from a first plasma gas comprising $N_2$ and Ar to form an activated species. The activated species is exposed to a second plasma formed from a second plasma gas comprising $NH_3$ and Ar to form the silicon nitride film. The method defines a deposition cycle and the deposition cycle is repeated to form a silicon nitride film of a predetermined thickness.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
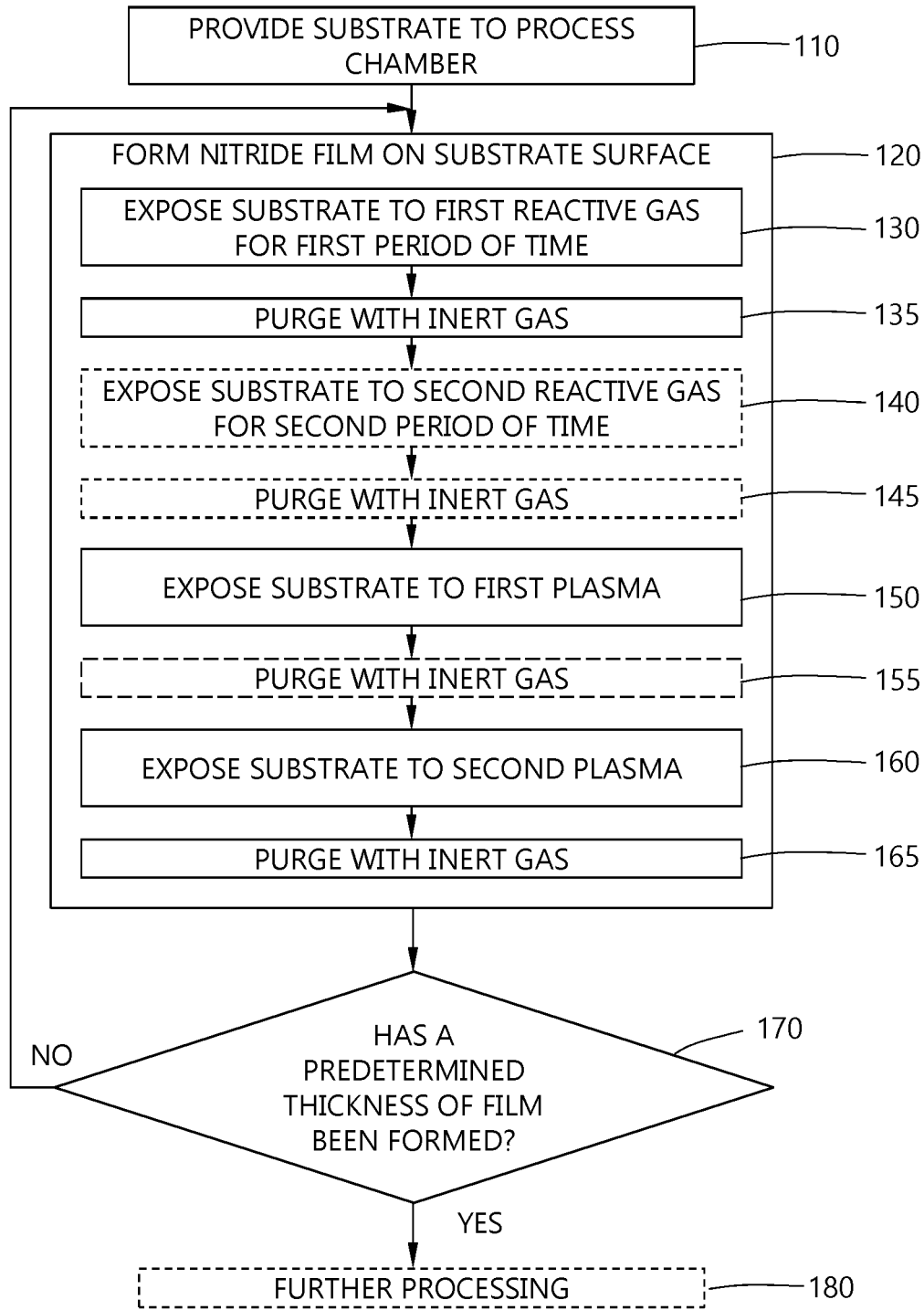
FIG. 1 illustrates an exemplary process sequence for the formation of a nitride film according to one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Embodiments of the present disclosure relate to methods for depositing nitride films using a plasma enhanced atomic layer deposition (PEALD) process. Some embodiments of the disclosure advantageously provide methods with greater growth per cycle. Some embodiments of the disclosure provide methods with higher throughput. Some embodiments of the disclosure advantageously provide higher quality films, including but not limited to, lower impurities, lower stress, lower resistivity and lower relative nitrogen content.

As used in the disclosure and the appended claims, a nitride film refers to a film consisting essentially of nitrogen anions and a cation. Unless indicated otherwise, no specific ratio of cation to nitrogen, stoichiometric or otherwise, should be inferred from the disclosure.

"Atomic layer deposition" or "cyclical deposition" as used herein refers to the sequential exposure of two or more reactive compounds to deposit a layer of material on a substrate surface. As used in this specification and the appended claims, the terms "reactive compound", "reactive gas", "precursor", "process gas" and the like are used interchangeably to mean a substance with a species capable of reacting with the substrate surface or material on the substrate surface in a surface reaction (e.g., chemisorption, oxidation, reduction). The substrate, or portion of the substrate, is exposed separately to the two or more reactive compounds which are introduced into a reaction zone of a processing chamber.

In a time-domain ALD process, exposure to each reactive compound is separated by a time delay to allow each compound to adhere and/or react on the substrate surface and then be purged from the processing chamber. In a spatial ALD process, different portions of the substrate surface, or material on the substrate surface, are exposed simultaneously to the two or more reactive compounds so that any given point on the substrate is substantially not exposed to more than one reactive compound simultaneously. As used in this specification and the appended claims, the term "substantially" used in this respect means, as will be understood by those skilled in the art, that there is the possibility that a small portion of the substrate may be exposed to multiple reactive gases simultaneously due to diffusion, and that the simultaneous exposure is unintended.

In time-domain ALD embodiments, exposure to each of the process gases are separated by a time delay/pause to allow the components of the process gases to adhere and/or react on the substrate surface. Alternatively, or in combination, in some embodiments, a purge may be performed before and/or after the exposure of the substrate to the process gases, wherein an inert gas is used to perform the purge. For example, a first reactive gas may be provided to the process chamber followed by a purge with an inert gas. Next, a second reactive gas may be provided to the process chamber followed by a purge with an inert gas. In some embodiments, the inert gas may be continuously provided to the process chamber and the first reactive gas may be dosed or pulsed into the process chamber followed by a dose or pulse of the second reactive gas into the process chamber. In such embodiments, a delay or pause may occur between the dose of the first reactive gas and the second reactive gas, allowing the continuous flow of inert gas to purge the process chamber between doses of the process gases.

In one aspect of a time-domain ALD process, a first reactive gas (i.e., a first precursor or compound A) is pulsed into the reaction zone followed by a first time delay. Next, a second precursor or compound B is pulsed into the reaction zone followed by a second delay. During each time delay, a purge gas, such as argon, is introduced into the processing chamber to purge the reaction zone or otherwise remove any residual reactive compound or reaction by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound A, purge gas, compound B and purge gas is a cycle. A cycle can start with either compound A or compound B and continue the respective order of the cycle until achieving a film with the predetermined thickness.

In an embodiment of a spatial ALD process, a first reactive gas and second reactive gas are delivered simultaneously to the reaction zone but are separated by an inert gas curtain and/or a vacuum curtain. The substrate is moved relative to the gas delivery apparatus so that any given point on the substrate is exposed to the first reactive gas and the second reactive gas.

In spatial ALD embodiments, exposure to each of the process gases occurs simultaneously to different parts of the substrate so that one part of the substrate is exposed to the first reactive gas while a different part of the substrate is exposed to the second reactive gas (if only two reactive gases are used). The substrate is moved relative to the gas delivery system so that each point on the substrate is sequentially exposed to both the first and second reactive gases. In any embodiment of a time-domain ALD or spatial ALD process, the sequence may be repeated until a predetermined layer thickness is formed on the substrate surface.

Figure 2:
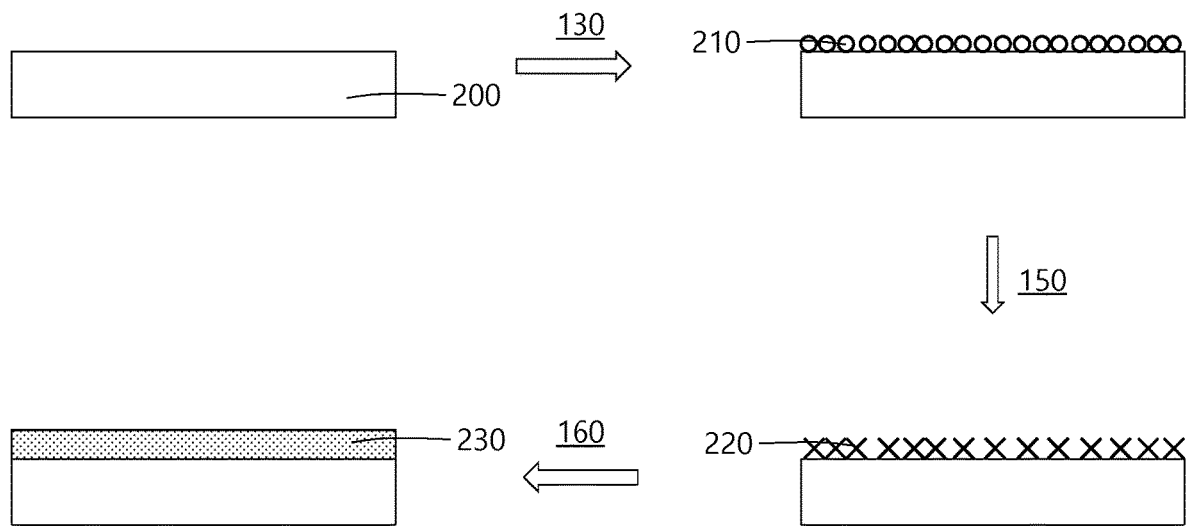
FIG. 2 illustrates an exemplary substrate during the formation of a nitride film according to one or more embodiment of the disclosure.

FIGS. 1 and 2 depict a generalized method 100 for forming a nitride film on a substrate 200 in accordance with one or more embodiment of the disclosure. The method 100 generally begins at 110, where a substrate 200 upon which a nitride film is to be formed is provided and placed into a processing chamber. As used herein, a "substrate surface" refers to any substrate surface upon which a layer may be formed. The substrate surface may have one or more features formed therein, one or more layers formed thereon, and combinations thereof. The substrate (or substrate surface) may be pretreated prior to the deposition of the nitride film, for example, by polishing, etching, reduction, oxidation, halogenation, hydroxylation, annealing, baking, or the like.

At 120, a nitride film is formed on the substrate surface. The nitride film may be formed via a cyclical deposition process, such as atomic layer deposition (ALD), or the like.

The process of forming the nitride film at 120 may begin by exposing the substrate to a first reactive gas. The first reactive gas comprises a precursor and is exposed to the substrate for a first period of time, as shown at 130. In some embodiments, the precursor is supplied without the use of a plasma.

A "pulse" or "dose" as used herein is intended to refer to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds, for example, the process gases described below.

The precursor may be any suitable compound to adsorb a layer of reactive species 210 on the substrate surface for later reaction. The reactive species 210 may also be referred to by the identity of the precursor. For example, exposing the substrate to a titanium precursor would form a reactive species 210 referred to as a titanium species.

In some embodiments, the precursor comprises one or more of Sc, Y, Ti, Zr, Hf, V, Nb, Ta, Cr, Mo, or W. Accordingly, in some embodiments, the nitride film comprises one or more of Sc, Y, Ti, Zr, Hf, V, Nb, Ta, Cr, Mo, or W. Similarly, in some embodiments, the precursor comprises one or more of Al, Ga, In, Si, Ge, or Sn. Accordingly, in some embodiments, the nitride film comprises one or more of Al, Ga, In, Si, Ge, or Sn.

In some embodiments, the nitride film comprises or consists essentially of TiN. In some embodiments, the nitride film comprises or consists essentially of SiN. In some embodiments, the precursor consists essentially of $TiCl_4$. In some embodiments, the precursor consists essentially of $SiH_2Cl_2$.

As used in this regard, a precursor which consists essentially of a stated species comprises greater than or equal to 95%, 98%, 99% or 99.5% of the stated species on a molar basis, excluding any inert diluent gases. Similarly, a film which consists essentially of a stated composition comprises greater than or equal to 98%, 99%, 99.5% or 99.9% of the atoms of the stated composition on an atomic count basis.

The durations for each pulse/dose are variable and may be adjusted to accommodate, for example, the volume capacity of the processing chamber as well as the capabilities of a vacuum system coupled thereto. Additionally, the dose time of a process gas may vary according to the flow rate of the process gas, the temperature of the process gas, the type of control valve, the type of process chamber employed, as well as the ability of the components of the process gas to adsorb onto the substrate surface. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

The period of time that the substrate is exposed to the precursor may be any suitable amount of time necessary to allow the precursor to form an adequate quantity of reactive species 210 atop the substrate surface. For example, the process gas may be flowed into the process chamber for a period of about 0.1 seconds to about 90 seconds. In some time-domain ALD processes, the precursor is exposed the substrate surface for a time in the range of about 0.1 sec to about 90 sec, or in the range of about 0.5 sec to about 60 sec, or in the range of about 1 sec to about 30 sec, or in the range of about 2 sec to about 25 sec, or in the range of about 3 sec to about 20 sec, or in the range of about 4 sec to about 15 sec, or in the range of about 5 sec to about 10 sec.

In some embodiments, an inert gas may additionally be provided to the process chamber at the same time as the precursor. In some embodiments, the precursor may be entrained within or delivered to the processing chamber in an inert gas. The inert gas may be mixed with the precursor (e.g., as a diluent gas) or be provided separately and can be pulsed or of a constant flow. In some embodiments, the inert gas is flowed into the processing chamber at a constant flow in the range of about 1 to about 10000 sccm. The inert gas may be any inert gas, for example, such as argon, helium, neon, or combinations thereof.

Additional process parameters may also be regulated while exposing the substrate to the precursor. Some process parameters (e.g., substrate temperature, chamber pressure) may be maintained relatively constant throughout the method 100.

In some embodiments, the process chamber may be maintained at a pressure of about 0.2 to about 100 Torr, or in the range of about 0.3 to about 90 Torr, or in the range of about 0.5 to about 80 Torr, or in the range of about 1 to about 50 Torr. In some embodiments, the process chamber is maintained at a pressure of less than or equal to 50 Torr, less than or equal to 25 Torr, less than or equal to about 10 Torr, less than or equal to about 5 Torr, or less than or equal to about 1 Torr.

In some embodiments, the temperature a substrate during processing may be maintained at a temperature in a range of 100° C. to 650° C., in a range of 200° C. to 500° C., or in a range of 250° C. to 550° C. In some embodiments, the substrate is maintained at a temperature greater than or equal to 100° C. and less than or equal to 650° C., less than or equal to 600° C., less than or equal to 550° C., less than or equal to 500° C., less than or equal to 450° C., less than or equal to 400° C., less than or equal to 350° C., or less than or equal to 300° C.

Next, at 135, the process chamber (especially in time-domain ALD) may be purged using an inert gas. (This may not be needed in spatial ALD processes as there are gas curtains separating the reactive gases.) The inert gas may be any inert gas, for example, such as argon, helium, neon, or the like. In some embodiments, the inert gas may be the same, or alternatively, may be different from the inert gas provided to the process chamber during the exposure of the substrate to the precursor at 130

In embodiments where the inert gas is the same, the purge may be performed by diverting the first reactive gas from the process chamber, allowing the inert gas to flow through the process chamber, purging the process chamber of any excess first reactive gas components or reaction byproducts. In some embodiments, the inert gas may be provided at the same flow rate used in conjunction with the first reactive gas, described above, or in some embodiments, the flow rate may be increased or decreased. For example, in some embodiments, the inert gas may be provided to the process chamber at a flow rate of about 0 to about 10000 sccm to purge the process chamber.

In spatial ALD, purge gas curtains are maintained between the flows of reactive gases and purging the process chamber may not be necessary. In some embodiments of a spatial ALD process, the process chamber or region of the process chamber may be purged with an inert gas.

The flow of inert gas may facilitate removing any excess first reactive gas components and/or excess reaction byproducts from the process chamber to prevent unwanted gas phase reactions of the first and second reactive gases.

Next, at 140, the substrate is optionally exposed to a second reactive gas for a second period of time. The second reactive gas comprises ammonia. In some embodiments, the ammonia is provided for a thermal reaction (without plasma). In some embodiments, the ammonia is provided as a plasma. If the ammonia is provided as a plasma, the ammonia may be mixed with argon and/or nitrogen gas ($N_2$) before being ignited to form the plasma.

Next, at 145, the process chamber may be purged using an inert gas. The purge step at 145 is similar to the purge step described above at 135.

Next at 150, the reactive species 210 formed at 130 is exposed to a first plasma generated from a first plasma gas to form an activated species 220. The first plasma comprises N* radicals. In some embodiments, the first plasma gas comprises nitrogen gas ($N_2$). In some embodiments, the first plasma gas further comprises argon. In some embodiments, the argon is flowed continuously while the nitrogen gas is pulsed.

In some embodiments, the first plasma gas is flowed into the processing chamber and then ignited to form a direct plasma. In some embodiments, the first plasma gas is ignited outside of the processing chamber to form a remote plasma.

In some embodiments, the first plasma is an inductively coupled plasma (ICP). In some embodiments, the first plasma is a conductively coupled plasma (CCP). In some embodiments, the first plasma is a microwave plasma. In some embodiments, the first plasma is generated by passing the first plasma gas over a hot wire.

Without being bound by theory, it is believed that the N* radicals of the first plasma act as a nitridation/densification treatment. In some embodiments, exposing the substrate to the first plasma acts to nitridate or densify a previously deposited layer of nitride film.

Next, at 155, the process chamber may be purged using an inert gas. The purge step at 155 is similar to the purge step described above at 135. In some embodiments, the process chamber is not purged between plasma exposures.

Next, at 160, the activated species 220 is exposed to a second plasma generated from a second plasma gas to form the nitride film 230. The second plasma comprises NH* radicals. In some embodiments, the second plasma gas comprises ammonia ($NH_3$). In some embodiments, the second plasma gas further comprises one or more of argon or nitrogen gas ($N_2$). In some embodiments, the argon and/or nitrogen gas is flowed continuously while the ammonia gas is pulsed.

In some embodiments, the second plasma gas is flowed into the processing chamber and then ignited to form a direct plasma. In some embodiments, the second plasma gas is ignited outside of the processing chamber to form a remote plasma.

In some embodiments, the second plasma is an inductively coupled plasma (ICP). In some embodiments, the second plasma is a conductively coupled plasma (CCP). In some embodiments, the second plasma is a microwave plasma. In some embodiments, the second plasma is generated by passing the second plasma gas over a hot wire.

Without being bound by theory, it is believed that the NH* radicals of the second plasma react with the reactive species 210 and/or activated species 220 to form the nitride film 230. Further, as the substrate is exposed to the NH* radicals after the N* radicals the hydrogen terminations of the substrate are not depleted and an increased number of reaction sites are available for the precursor to form the reactive species 210.

Next, at 165, the process chamber may be purged using an inert gas. The purge step at 165 is similar to the purge step described above at 135.

While the generic embodiment of the processing method 100 shown in FIGS. 1 and 2 includes three or four pulses of reactive gases, it will be understood that this is merely exemplary and that additional pulses of reactive gases may be used. The sub processes of 120 comprise a cycle.

Next, at 170, it is determined whether the nitride film has achieved a predetermined thickness. If the predetermined thickness has not been achieved, the method 100 returns to 120 to continue forming the nitride film until the predetermined thickness is reached. Once the predetermined thickness has been reached, the method 100 can either end or proceed to 180 for optional further processing (e.g., bulk deposition of a metal film, anneal).

The nitride films deposited by the disclosed methods are superior to nitride films deposited by other plasma processes and/or thermal processes.

The titanium nitride films of this disclosure have a predetermined titanium:nitrogen (Ti:N) ratio. For example, when the precursor comprises $TiCl_4$ and the nitride film is a titanium nitride film, the predetermined Ti:N ratio is greater than or equal to 1.0, greater than or equal to 1.1 or greater than or equal to 1.12. In some embodiments, the predetermined ratio is greater than or equal to the ratio of a titanium nitride film deposited by a plasma process with only a single plasma exposure. In some embodiments, the predetermined ratio is greater than or equal to the ratio of a titanium nitride film deposited by a thermal process.

For those embodiments when the precursor comprises chlorine, the nitride films of this disclosure have a lower chlorine ($Cl^-$) content. In some embodiments, the nitride films of this disclosure have a lower chlorine ($Cl^-$) content than a nitride film deposited by a plasma process with only a single plasma exposure. In some embodiments, the nitride films of this disclosure have a lower chlorine ($Cl^-$) content than a nitride film deposited by a thermal process.

In some embodiments, the nitride films of this disclosure have a lower film stress. In some embodiments, the film stress of a titanium nitride film is less than or equal to 900 MPa, less than or equal to 800 MPa, less than or equal to 700 MPa, less than or equal to 600 MPa, less than or equal to 500 MPa, less than or equal to 400 MPa, or less than or equal to 300 MPa. In some embodiments, the nitride films of this disclosure have a lower film stress than a nitride film deposited by a plasma process with only a single plasma exposure. In some embodiments, the nitride films of this disclosure have a lower film stress than a nitride film deposited by a thermal process.

In some embodiments, the nitride films of this disclosure have lower resistivity. In some embodiments, the resistivity of a titanium nitride film is less than or equal to 200 $\mu\Omega\cdot cm$, less than or equal to 180 $\mu\Omega\cdot cm$, less than or equal to 160 $\mu\Omega\cdot cm$, less than or equal to 150 $\mu\Omega\cdot cm$, or less than or equal to 140 $\mu\Omega\cdot cm$. In some embodiments, the nitride films of this disclosure have a lower resistivity than a nitride film deposited by a plasma process with only a single plasma exposure. In some embodiments, the nitride films of this disclosure have a lower resistivity than a nitride film deposited by a thermal process.

In some embodiments, the nitride films of this disclosure have greater growth per cycle (GPC). In some embodiments, the nitride films of this disclosure have a greater GPC than a nitride film deposited by a plasma process with only a single plasma exposure. In some embodiments, the nitride films of this disclosure have a greater GPC than a nitride film deposited by a thermal process.

In some embodiments, the GPC of a titanium nitride film deposited with a precursor comprising $TiCl_4$ is greater than or equal to 0.25 Å/cycle, greater than or equal to 0.30 Å/cycle, greater than or equal to 0.33 Å/cycle, greater than or equal to 0.35 Å/cycle, greater than or equal to 0.37 Å/cycle, greater than or equal to 0.38 Å/cycle, greater than or equal to 0.39 Å/cycle, greater than or equal to 0.40

Å/cycle, greater than or equal to 0.41 Å/cycle, greater than or equal to 0.42 Å/cycle, or greater than or equal to 0.43 Å/cycle.

In some embodiments, the GPC of a silicon nitride film deposited with a precursor comprising $SiH_2Cl_2$ is greater than or equal to 0.45 Å/cycle, greater than or equal to 0.50 Å/cycle, greater than or equal to 0.55 Å/cycle, greater than or equal to 0.60 Å/cycle, greater than or equal to 0.65 Å/cycle, greater than or equal to 0.7 Å/cycle, or greater than or equal to 0.75 Å/cycle.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of depositing a nitride film, the method comprising:
   exposing a substrate to a precursor to form a reactive species;
   exposing the reactive species to a first plasma formed from a first plasma gas flow to form an activated species, the first plasma comprising N* radicals; and
   exposing the activated species to a second plasma formed from a second plasma gas flow to form the nitride film, the second plasma comprising NH* radicals, wherein the first plasma gas flow and the second plasma gas flow are separated by a purge gas, and the method defines a deposition cycle, and the deposition cycle is repeated until a predetermined thickness of the nitride film has been formed.

2. The method of claim 1, wherein the nitride film comprises one or more of Sc, Y, Ti, Zr, Hf, V, Nb, Ta, Cr, Mo, or W.

3. The method of claim 2, wherein the nitride film comprises TiN.

4. The method of claim 3, wherein the precursor consists essentially of $TiCl_4$.

5. The method of claim 4, wherein the TiN film grows at a rate of greater than or equal to 0.3 Å/cycle.

6. The method of claim 5, wherein the TiN film has a stress of less than or equal to 800 MPa.

7. The method of claim 5, wherein the TiN film has a bulk resistivity of less than or equal to 200 $\mu\Omega\cdot cm$.

8. The method of claim 1, wherein the first plasma gas comprises $N_2$.

9. The method of claim 1, wherein the second plasma gas comprises $NH_3$.

10. The method of claim 9, wherein $NH_3$ is pulsed into the second plasma gas.

11. The method of claim 1, wherein the first plasma gas and the second plasma gas comprise Ar.

12. The method of claim 1, wherein one or both of the first plasma and the second plasma are generated by a microwave plasma.

13. The method of claim 1, wherein one or both of the first plasma and the second plasma are generated by a hot wire.

14. The method of claim 1, wherein the nitride film comprises one or more of Al, Ga, In, Si, Ge, or Sn.

15. The method of claim 14, wherein the nitride film comprises SiN.

16. The method of claim 15, wherein the precursor consists essentially of $SiH_2Cl_2$.

17. The method of claim 15, wherein the SiN film grows at a rate of greater than or equal to 0.5 Å/cycle.

18. A method of depositing a titanium nitride film, the method comprising:
   exposing a substrate to $TiCl_4$ to form a titanium species on the substrate;
   exposing the titanium species to a first plasma formed from a first plasma gas flow comprising $N_2$ and Ar to form an activated species; and
   exposing the activated species to a second plasma formed from a second plasma gas flow comprising $NH_3$ and Ar to form the titanium nitride film, wherein the first plasma gas flow and the second plasma gas flow are separated by a purge gas, and
   wherein the method defines a deposition cycle and the deposition cycle is repeated to form a titanium nitride film of a predetermined thickness.

* * * * *